(12) United States Patent
Frink

(10) Patent No.: US 6,868,314 B1
(45) Date of Patent: Mar. 15, 2005

(54) UNMANNED AERIAL VEHICLE APPARATUS, SYSTEM AND METHOD FOR RETRIEVING DATA

(76) Inventor: Bentley D. Frink, 5621 Harvest Grove La., Wilmington, NC (US) 28409

(*) Notice: Subject to any disclaimer, the term of this patent is extended or adjusted under 35 U.S.C. 154(b) by 0 days.

(21) Appl. No.: 10/186,154

(22) Filed: Jun. 27, 2002

Related U.S. Application Data

(60) Provisional application No. 60/301,561, filed on Jun. 27, 2001.

(51) Int. Cl.[7] .................................................. B64C 1/16
(52) U.S. Cl. ......................................... 701/3; 244/119
(58) Field of Search ................... 701/1, 3, 13; 244/154, 244/155 R, 117 R, 119–121, 123, 126

(56) References Cited

U.S. PATENT DOCUMENTS

| | | | |
|---|---|---|---|
| 5,184,516 A | * | 2/1993 | Blazic et al. .................. 73/799 |
| 5,779,190 A | | 7/1998 | Rambo et al. |
| 5,863,597 A | * | 1/1999 | Lynch .......................... 427/96 |
| 5,890,441 A | | 4/1999 | Swinson et al. |
| 5,965,848 A | | 10/1999 | Altschul et al. |
| 5,983,094 A | | 11/1999 | Altschul et al. |
| 6,167,263 A | * | 12/2000 | Campbell .................... 455/431 |
| 6,181,989 B1 | | 1/2001 | Gwozdecki |
| 6,194,095 B1 | | 2/2001 | Hockaday |
| 6,215,221 B1 | | 4/2001 | Cabuz et al. |
| 6,286,410 B1 | * | 9/2001 | Leibolt ...................... 89/1.809 |
| 6,400,647 B1 | | 6/2002 | Huntress |
| 2002/0113165 A1 | * | 8/2002 | Moshier |

* cited by examiner

*Primary Examiner*—Thu V. Nguyen
(74) *Attorney, Agent, or Firm*—MacCord Mason PLLC

(57) ABSTRACT

The present invention relates to a system for retrieving data from remote difficult to reach terrain, such as wilderness areas, etc. and in particular to a system comprised of one or more surface based data collectors in communication with one or more wireless transceivers adapted to transmit the collected data to an unmanned aerial vehicle adapted to fly within a predetermined distance from the data collector and receive data collected therefrom. The present invention further relates to an unmanned aerial vehicle adapted to fly a flight pattern relative to a moveable surface object or for controlling the position of a moveable surface object relative to the flight path of the unmanned aerial vehicle. Finally, the present invention relates to an improved unmanned aerial vehicle having airframe structural elements with electrical circuits adhered to the surfaces of the structural elements.

14 Claims, 4 Drawing Sheets

UNMANNED AERIAL VEHICLE APPARATUS, SYSTEM AND METHOD FOR RETRIEVING DATA

This application claims the benefit of U.S. Provisional Application No. 60/301,561 filed Jun. 27, 2001.

BACKGROUND OF THE INVENTION

Field of the Invention

The present invention relates to an unmanned aerial vehicle, in particular, to an unmanned aerial vehicle apparatus suitable for retrieving data collected in remote or hazardous locations.

Description of the Prior Art

Ground-based instruments are currently used to collect a variety of information. These instruments are used, for example, to collect environmental data, including information concerning air and water quality, as well as water levels in wetlands studies. Other examples are sensors for measuring or detecting soil moisture, dissolved oxygen, biological activity and pH. Numerous opportunities exist for collection of other types of data. Use of such instruments is limited, however, by the difficulty or inconvenience in initially placing the instruments at the location required for collection of the relevant data, and in the subsequent retrieval of collected data with the desired frequency.

In environmental studies, for example, it is frequently necessary for the user to position the instruments at several desired sites within a large wilderness area. Swampy or thickly brush-covered terrain must often be traversed. Often, the travel time to and from the area requires the user to overnight in the area. The instruments often remain in place for months. During this time, it is necessary for the user to trek to the instruments each time data is to be collected, which is often as frequently as once a week.

For some applications, such as stream level gauging, data is remotely collected by transmitting the information from the collector to a remote receiver, or to an intermediate re-transmitter, such as a satellite. However, transmission of data requires costly radio equipment, and a large power source. As a result, remote collection of data, until now, has been cost prohibitive for most applications. For example, government satellites are used to retrieve data collected autonomously from remote locations around the world. While retrieval of remote field data by way of satellite is appropriate in some cases, it is not practical or even possible for a large number of data retrieval sessions. The fact is satellite data retrieval is limited by at least three considerable constraints.

One constraint is uplink time allocations that demand relatively expensive very precise time keeping components that must be monitored and adjusted frequently. Furthermore, there are a limited number of time slots available; therefore, users must gain an assigned time slot through a slow bureaucratic approval process. Worse still, satellites are distant and require significant amounts of power from the remote ground-based station in order to communicate effectively. Large power budgets require large heavy expensive batteries usually augmented by even more expensive and fragile solar arrays.

Cellular data phones are another data retrieval option that is far from being an ideal solution. Cellular telephone coverage seems to be everywhere these days and billing rates are generally acceptable for the typical cellular customer. However, when considered for use as data retrieval devices for collecting data from remote locations, cellular systems fall well short of being a practical solution in many cases.

For example, there are many remote locations in the United States not to mention the rest of the world that do not and will not for the foreseeable future, have cellular coverage. Moreover, even in cellular coverage areas, data retrieval using cellular technology remains impractical for a significant number of ground-based data collection sites. Even though cellular transmitters require less power budget than satellite uplinks, the cost of equipping every desired data site with a cellular phone and rate plan is prohibitive in many cases.

SUMMARY OF THE INVENTION

The present invention relates to an unmanned aerial vehicle adapted to retrieve data collected by a surface based data collector that is adapted to send its collected data to the unmanned aerial vehicle. The present invention further relates to an unmanned aerial vehicle adapted to fly a flight pattern relative to a moveable surface object or for controlling the position of a moveable surface object relative to the flight path of the unmanned aerial vehicle. Finally, the present invention relates to an improved unmanned aerial vehicle having airframe structural elements with electrical circuits adhered to the surfaces of the structural elements.

Data Retrieval

The present invention is a data retrieval system that uses an unmanned aerial vehicle to retrieve collected data from at least one surface data collection instrument. For the purpose of this disclosure, an unmanned aerial vehicle is defined as an air vehicle that does not carry a human operator and is capable of flight beyond visual line-of-sight range under remote control or autonomous control. Also for the purpose of this disclosure, the unmanned aerial vehicle of the present invention can be the size of a passenger plane down to and including the size of micro air vehicles that are less than about six inches in length width and height. However, the greatest benefits of the invention can be realized by unmanned aerial vehicles that weigh less than 40 kilograms. Furthermore, for the purpose of this invention, a surface based data collector is an electronic device based on the earth's surface that electronically records data for future retrieval.

The unmanned aerial vehicle of the present invention comprises a low power communication means for communicating with a data collector useful for collecting data relating to changes in an environmental condition over an extended time period and for storing the data in the data collector for later retrieval using the unmanned aerial vehicle to retrieve the collected data. The surface based data collector can communicate with sensors such as a water quality sensors for sensing dissolved oxygen, pH, turbidity, biological activity and the like. The surface data collector can be in constant or intermittent communication with a surface based low power wireless communication system having an effective transmission range of between 0.3 km and 5 km for transmitting the collected data over short distances. A data storage memory either onboard the unmanned aerial vehicle or at a data retrieval ground station is used to store the retrieved data.

Other types of data such as digitally recorded images and sounds can be retrieved by the unmanned aerial vehicle of the present invention. Digital devices such as digital cameras and digital audio recorders can collect Media type data. For example, digital cameras are currently available for capturing images of game animals in wilderness areas. Typically, these "game" cameras are attached to trees along side a game path. Whenever a game animal such as a deer passes within camera view, an infrared, ultrasonic or radar sensor triggers the digital camera to capture an image.

Digital "game" cameras and digital audio recorders can also be used by law enforcement agencies and the military to monitor illegal or enemy activities along a border area within a wilderness area or combat area. At the moment, there are no cost effective ways to retrieve data collected by such digital devices located in very remote and hazardous areas. Unfortunately, up to now, data from these type devices is most often retrieved by sending a person to the data collection site to manually retrieve data cards or data tapes. In the case of game hunters, physical retrieval of data is not only inconvenient but also undesirable from the standpoint of not wanting to alert game animals to human activity in the area. In the case of law enforcement and the military, physical data retrieval poses a risk of ambush and capture to data retrieving personnel. Fortunately, the present invention allows data to be retrieved autonomously from digital devices equipped with transmitters or transceivers without any need for a person to travel to the data collection site.

The present invention allows data collection personnel to launch an unmanned aerial vehicle miles away from the data collection site eliminating the need for personnel to physically be present at the data collection site in order to retrieve collected data. The unmanned aerial vehicle of the present invention can be preprogrammed with navigation waypoints that are used by an onboard flight computer to navigate the unmanned aerial vehicle along a data retrieval route. Alternatively, a radio link between a mobile command unit and the unmanned aerial vehicle can be provided to upload route waypoints to the unmanned aerial vehicle while the unmanned aerial vehicle is in flight. Then again, the command unit can also be a tactically positioned ground station for the same purpose. The command unit also preferably includes a bi-directional radio link that allows the monitoring of an unmanned aerial vehicle during flight. The bi-directional radio link can be a commercially available radio data modem transmitting over licensed or unlicensed frequencies, dependent upon restrictions such as maximum usable range, etc. If the unmanned aerial vehicle is to be operated in areas having cellular telephone coverage, an on-board cellular phone can be used to web enable the unmanned aerial vehicle allowing a user to monitor flight data, upload new route waypoints or to recover retrieved data directly through an Internet web site.

The unmanned aerial vehicle of the present invention can also be used to send down new instructions or commands to surface devices having digital communication capabilities. For instance, many of today's digital devices execute software that is resident in field programmable memory such as flash memory. Once within range of such a digital device, a data transfer processor on the unmanned aerial vehicle can transfer revised or new software into a surface based instrument. For military applications the unmanned aerial vehicle could be used to transmit commands to activate or deactivate intelligent ordinance. In a law enforcement application, the unmanned aerial vehicle could be used to transmit commands to disable a stolen vehicle, etc.

Another great application for the data retrieval system of the present invention is the collection of utility meter data, such as electric meter watt-hour readings whenever such meters are located in rural or isolated areas. Urban data collection is sometimes collected using vans equipped with wireless transceivers that automatically read data from transceiver equipped utility meters. This may be an appropriate solution for collecting utility meter data in urban areas where meter density can be as high as thousands of meters per square mile, but it is a very inefficient and costly way to collect data from rurally located utility meters that can number less than ten per square mile. Another factor adding to unacceptable cost and inefficiency, with regard to surface vehicle retrieval of utility meter data in rural areas, results from the lack of good road infrastructure. Driving a data collection route on unpaved or poorly maintained roads can result in damaged vehicles and increased maintenance costs. Furthermore, after adverse weather events such as floods or heavy snow, it may not be possible to use transceiver equipped surface vehicles to read meters in a timely fashion even in urban areas. Fortunately, the present invention is capable of flying over surface obstacles such as flooded out roadways without any interruption to the data retrieval process.

Furthermore, the present invention is ideally suited to take advantage of a newly legalized form of radio communication known by industry as ultra-wideband (UWB) radio. Ultra-wideband communication systems transmit information using electromagnetic impulses without using a radio frequency carrier. Presently, the FCC restricts UWB transmissions to extremely low power emission, resulting in a range limit of only a few hundred meters and unfortunately UWB receivers are susceptible to traditional narrow band transmitters common to urban areas. Nevertheless, UWB transmitters and receivers combined with the present invention make a powerful combination. The reason is UWB has the ability to transfer large amounts of data quickly due to its large bandwidth. Moreover, UWB systems employ transmitters and receivers that consume far less power than traditional transmitters and receivers making then very attractive for long duration field deployment. However, before the present invention data retrieval from UWB systems located in hard to get to places was impractical. An added benefit of combining a UWB system with the present invention is that the UWB system can also function as a low altitude radar altimeter. Similarly, because UWB also has a short-range geo-location capability, the UWB system could be employed as an automated landing system at an airfield equipped with a compatible UWB system. Finally, the communication need not be limited to radio frequency systems. An alternative can be a light beam communication system such as a broad beam laser, etc.

The unmanned aerial vehicle of the present invention can be a glider, airplane, helicopter, dirigible, rocket, powered parachute or jet aircraft and preferably has the following:

(a) a wireless communications system for communicating with surface based data collectors. The wireless communications link is preferably a low power transceiver incorporating a transceiver integrated circuit such as RF Micro Device's 2905. The communication system can be unlicensed or licensed. However, the present invention is useful for retrieving data from surface based wireless transceivers that transmit no more power than is necessary to reliably communicate over a range of three hundred meters. FCC Part 15 transmitters having an output RF power level of about 0.1 Watt are useable with the present invention. Furthermore, direct sequence spread spectrum transmitters having one Watt total output power is also useable with the present invention. An appropriate antenna is also necessary. Such antennas can include but are not limited to dipole, micro-strip, helical, and micro-patch.

(b) a navigation system, preferably a global positioning receiver such as Axiom navigation's Swift A1. The navigation system could also use an electronic flux gate compass. The navigation system should have waypoint or flight path storage for guiding the unmanned aerial vehicle to within communication range of surface based data collectors. The flight path waypoints can include precise geographical longitude and latitude coordinates. In addition, the navigation system can be backed up or augmented with an inertial guidance system. Elements of the inertial guidance system can include but are not limited to accelerometers and gyroscopes.

(c) at least one altimeter, preferably an electronic barometric scale pressure sensor such as an integrated circuit pressure sensor. A radar altimeter using Micropower radar technology can also be incorporated. Other altimetry possibilities could be LIDAR range or even ultra-sonic ranging.

(d) at least one flight control computer that receives information from the navigation system and altimeter. The flight computer generates output signals that control servos used to actuate the unmanned aerial vehicle's flight control surfaces controlling roll, pitch and yaw to safely guide the unmanned aerial vehicle along a predetermined flight path. The flight computer can also be in communication with a flight stabilization sensor that outputs control signals based upon the unmanned aerial vehicles position with respect to the earth's horizon. Such a sensor is disclosed in U.S. Pat. No. 6,181,989 to Gwozdecki. In flight operations over mountainous terrain horizon sensors such as that disclosed by Gwozdecki do not work well therefore an inertial sensor such as an inclined gyroscope can be substituted.

(e) data storage for the retrieved data. The data storage could be flash memory, SRAM, magnetic hard drive, R/W optical drive, diskette, etc. The unmanned aerial vehicle could carry as a payload a personal digital assistant such as a Compact Ipaq, Palm Pilot, or Mind Spring Visor programmed to communicate with the ground device once the unmanned aerial vehicle is within communication range of a data collection instrument of the surface.

Preferably the unmanned aerial vehicle also has the following:

(a) a propulsion system. The flight control computer controls the thrust of a propulsion system by way of output signals that control the energy consumption rate of the propulsion system. The propulsion system for the unmanned aerial vehicle can be selected from a number of power plants such as but not limited to, internal combustion engines, jet engines, rocket engines, and electric motors powered by energy stored in capacitors, batteries or electric power fuel cells. Other sources of electrical energy could come from microwave beams, light beams or solar cells. The unmanned aerial vehicle could also be a glider dropped from a balloon or other aerospace craft. Furthermore, the unmanned aerial vehicle could be a towed or a surface launched glider.

(b) a recovery parachute of standard type or maneuverable airfoil type.

(c) radio control receiver for receiving commands from a model aircraft radio control transmitter or an impulse radio receiver adapted to receive flight control commands from an impulse radio transmitter.

(d) a payload bay controlled by a flight computer to dispense disposable sensors over user selected GPS coordinates or along pre-selected waypoints.

(e) at least one hard-point on the fuselage or wing for carrying extra fiel, payload or deployable sensors including disposable sensors.

Other features

The unmanned aerial vehicle flight computer can be programmed to dispense a disposable drift buoy that includes a GPS receiver along with a communications means that transmits position data to the unmanned aerial vehicle. The unmanned aerial vehicle's navigation system can use the buoy position data to track or follow the buoy. The data could also be relayed to a surface craft or ground station or other aircraft including other unmanned aerial vehicles. The unmanned aerial vehicle can also be a disposable glider dropped from a balloon or other aircraft.

Each surface data collector can include at least one datalogger and one sensor. The surface data collector is in communication with at least one surface based transmitter. In this way, a means is provided for retrieving data from ground-based instruments by transmitting data from the collection site to an unmanned aerial vehicle, such as a radio-controlled airplane, as the unmanned aerial vehicle moves within a pathway above the instruments at an altitude of 200–400 feet AGL. Collected data can then be relayed from the unmanned aerial vehicle to a remote base station, or stored within the unmanned aerial vehicle until the unmanned aerial vehicle returns to the base station, at which time the data can be downloaded.

One possible data collector can be a power line sag meter that measures power line sag during peak load periods. A data collector for measuring power line sag can include a radar sensor that measures line droop relative to the ground. An unmanned aerial vehicle of the present invention can be adapted to fly over or near power lines to retrieve the data collected from the power line sag data collectors.

The system in it's simplest form consists of a flying radio controlled aircraft weighing less than 40 kgs, an onboard digital memory unit with processor, and a wireless interface operating under a protocol such as IEEE 802.11, Home RF, Bluetooth or perhaps some other proprietary protocol. Enhancements to the system would include but are not limited to, a global positioning system (GPS) receiver for directing the unmanned aerial vehicle to a ground based sensor location and an on board autonomous flight control system such as flight computer, waypoint memory, wing leveler, rate gyro, altimeter (radar or barometric), airspeed indicator, additional flight control uplink, automatic landing para foil or parachute, etc.

Components of the systems are: A unmanned aerial vehicle, a ground-based transceiver to be attached to the existing ground-based data collection instrument, and an unmanned aerial vehicle-carried transceiver. The unmanned aerial vehicle used in the system has adequate power and load-carrying capacity to remain airborne for a sufficient time to carry the instrument along the retrieval pathway, i.e., up to 120 minutes or more. The selected unmanned aerial vehicle aerodynamic design is configured for stability in windy conditions, permitting retrieval of data of the widest possible range of weather conditions.

The ground-based transceiver is attached to existing ground-based collection instruments by appropriate cabling, an IR port, radio link or other connection means. Data can be periodically transferred from the collection instrument to the ground-based transceiver. The ground-based transceiver can be in "sleep mode" most of the time, however the receiver part of the transceiver can periodically "wake up" and briefly "listen" for a transmission from an unmanned aerial vehicle transceiver. Upon receipt of a signal from the unmanned aerial vehicle transceiver, indicating that the unmanned aerial vehicle transceiver is within transmission range, the ground-based transceiver will upload the collected data to the unmanned aerial vehicle transceiver for storage or retransmission. Alternatively, a surface data collection station having only a transmitter can be programmed to broadcast its data at scheduled intervals.

Additional refinements can be incorporated into the system. For example, a diagnostic program can be included in the ground-based transceiver, so that data relating to the condition of the ground-based transceiver and the collection instrument, including the reasons for any malfunction, can be transmitted to the unmanned aerial vehicle transceiver, eliminating the need for the user to physically go to the site to determine reasons for a malfunction. If the condition does require the user to travel to the site, the user will know what to expect, and whether a replacement instrument must be transported to the site.

Using a handheld PC, the pilot can enter navigation data into the unmanned aerial vehicle's flight control computer. He also can use the handheld PC to initialize the onboard data retrieval computer. While the onboard computer(s) perform a diagnostic self-check, the pilot preflights and fuels the unmanned aerial vehicle. The pilot is now ready for take off. He or she launches the unmanned aerial vehicle by way of a portable launcher, a hand toss or a short takeoff roll. Once the unmanned aerial vehicle is at a safe altitude, 300 ft or higher, the pilot has the option of flying the unmanned vehicle in one of several modes. The first mode is the RPV or remote piloted vehicle mode. In this mode the pilot controls the aircraft's every movement. The pilot must direct the aircraft visually to the ground sensor location. This mode is useful when a surface sensor is relatively close but inaccessible, i.e. a ground sensor on a small island in a river. In other words, this mode is the "you can see it but you can't get there from here on the ground mode".

A second mode of operation is an autonomous flight mode; in this mode the pilot passes control of the flight over to the onboard flight control computer. The flight computer uses an onboard GPS receiver along with other control elements such as the wing leveler, etc. to guide the unmanned aerial vehicle to within range of surface based data collectors whose coordinates are preferably uploaded into the unmanned aerial vehicle's navigation system before takeoff. (With an onboard uplink capability, it is possible to upload additional waypoints and surface station coordinates while a flight is in progress.)

When in autonomous mode the unmanned aerial vehicle's flight computer is in communication with flight dynamic sensors as well as the navigation system. The flight dynamic sensors output signals proportional to the flight dynamics experienced by the unmanned aerial vehicle while in flight. The flight dynamic signals are responsive to airspeed, altitude, roll, pitch and yaw and are inputs into the flight control computer. The gains of the flight dynamic signals are adjusted for straight and level flight. The flight control computer uses these signals as feedback to adjust the flight control surfaces of the unmanned aerial vehicle in order to maintain straight and level flight. Flight control surfaces such as a rudder and elevators on an airplane are positioned by servos controlled by the flight computer. The navigation system outputs signals relating to the difference between the unmanned vehicle's current position, heading and speed and the vehicle's desired position, heading and speed, based upon a stored flight plan that includes waypoints to the surface based data collectors. The flight computer uses the navigation signals as input to temporarily override signals from the flight dynamic sensors in order to steer the unmanned aerial vehicle unto the proper flight path.

Once within range (300 meters) of a surface station the onboard data retrieval computer can commence an initialization sequence that creates a data transfer link between the aircraft above and the surface station below. The flight control computer can force the unmanned aerial vehicle to circle the surface station until the data transfer transaction is complete. In this case, the data transfer continues until all data is completely transferred to the memory cache on board the unmanned aerial vehicle. Once data transfer is complete, the unmanned aerial vehicle can continue to the next surface data collector or it can return to the launch site or follow waypoints to a designated landing site. When the unmanned aerial vehicle gets to a designated landing site, a number of actions can be taken. The most common is to have a waiting pilot take manual control of the unmanned aerial vehicle once it is within visual range. Alternately, if no pilot is at the landing area the flight control computer can fly the unmanned aerial vehicle over the same or another predetermined landing area, shut off the power plant (gas engine or electric motor) and deploy a landing parachute or Para foil. Once the unmanned aerial vehicle has landed on the surface, the contents of its onboard memory, the recovered data in this case, can be downloaded to a handheld PC or other type of data storage device. The financial savings attributable to the unmanned aerial vehicle system of the present invention when used for data retrieval is substantial. A minimum fixed cost of the unmanned aerial vehicle system can range less than ten thousand dollars. Second, the unit cost of the wireless data link would be very inexpensive compared to cellular phone modem. In fact, BlueTooth hardware is predicted to be less than $100 beginning in 2002–2003.

Position Control Modes

Other modes of flight navigation include a standard radio control mode. In this mode of operation, the operator uses a radio control transmitter to control the unmanned aerial vehicle during take-offs and landings. Yet another mode of flight navigation uses the unmanned aerial vehicle's onboard data transceiver(s) and processor(s) to automatically receive navigation data from a movable surface object. A flight navigation computer onboard the unmanned aerial vehicle then uses the surface object's navigation data, i.e., position, heading and speed to control the unmanned aerial vehicle's flight path. This mode of operation is useful but not limited to tracking the surface object. The surface object can be a person, or animal. The surface object can be a marine vessel such as a boat, ship or other type of marine vehicle. The surface object can also be a land vehicle such as an automobile, patrol car, robot, army tank, motorcycle or other type of land vehicle. The tracking can be extending to flying objects such as a bird fitted with a transmitter and GPS receiver. The unmanned aerial vehicle can also be used to adjust the position of sub-surface objects such as torpedoes.

One application for this mode of operation is fish spotting for commercial or sport fishermen. In this case, the movable surface object is a marine vessel i.e., a fishing boat. The marine vessel is equipped with a global positioning system and a wireless uplink transmitter for transmitting position adjustment commands to an unmanned aerial vehicle. The unmanned aerial vehicle is equipped with a flight navigation system in communication with both an onboard global positioning system and an onboard wireless receiver that receives position adjustment commands from the marine vessel.

The unmanned aerial vehicle further includes an onboard video camera in communication with an onboard television transmitter for transmitting aerial images of the sea. The marine vessel is further equipped with a television receiver and video monitor for receiving and displaying video images transmitted from the unmanned aerial vehicle.

The unmanned aerial vehicle can be programmed to fly in a pattern relative to the marine vessel. The pattern can be any pattern within the flight envelop of the unmanned aerial vehicle. For example, the unmanned aerial vehicle can be commanded to fly directly over the marine vessel, matching the marine vessel's speed and heading or the unmanned aerial vehicle can be programmed to fly in a oval pattern offset relative the position of the marine vessel.

In operation, fish are visually spotted by releasing the unmanned aerial vehicle into flight and by monitoring video images of the sea transmitted from the unmanned aerial vehicle. If small enough the unmanned aerial vehicle can be hand-launched; if too large to be hand-launched, the unmanned aerial vehicle can be launched from a catapult or from the sea surface similar to a manned seaplane. The unmanned aerial vehicle then can fly autonomously in a pattern relative to the marine vessel while transmitting real-time video images of the sea below. A crewman onboard the marine vessel views a video monitor adapted to display the images being transmitted from the unmanned aerial vehicle. Whenever fish are spotted, the crewman can issue a command by way of the wireless uplink transmitter commanding the unmanned vehicle to fly a pattern relative to the located fish.

In the case where the surface object is a surface vehicle with a navigation system and data transceiver such as a boat with an automatic pilot, a mode of operation opposite to that previously discussed is possible. In this opposite mode, navigation data, i.e., position, heading and speed could be down linked to the surface craft. This mode allows the surface craft to automatically adjust its path based upon the flight path of the unmanned aerial vehicle. For example, the unmanned aerial vehicle may have a television camera and transmitter, transmitting a video signal linked back to a surface station. A surface operator in control of the unmanned aerial vehicle by way of radio control could view a video display of the down linked video searching for instance, a distressed swimmer in the ocean. In this scenario, a manned or unmanned watercraft would be remotely driven via the navigation data downlink to the distressed swimmer's rescue.

Improved Unmanned Aerial Vehicle

The present invention provides a novel airframe construction that allows for any given size, a much greater amount of avionics and other electronic and electrical systems to be carried aloft by a unmanned aerial vehicle than that realized by the prior art. The novel airframe integrates printed circuits into airframe structural members and outer-skin that covers the airframe. This integration makes much more efficient use of volume or space than the airframe of conventional miniature air vehicles. The extra space available as a result of this integration allows for more fuel and payloads such as droppable disposable sensors and lab-on-chip technology such as a miniature gas chromatograph.

As a result of space saving integration that combines circuitry with airframe structural members, the unmanned aerial vehicle of the present invention is able to carry far more electronics than is possible before this invention. As such more elaborate data transceivers, processors along with large amounts of memory can be used to retrieve and store data transmitted from surface based data collection stations. Benefits of the present invention are not limited to any particular type of unmanned aerial vehicle; benefits extend to gliders, airplanes, helicopters, dirigibles, rockets, powered parachutes or jet aircraft.

A construction method for greatly increasing the useful payload of an unmanned aerial vehicle is described. Unmanned aerial vehicles have the common structural elements found in manned aircraft. These elements include fuselage bulkheads, wing spars and wing ribs as well as the outer-skin covering. These structural elements are made of materials such as balsa wood, fiberglass, carbon fiber, plastic and aluminum.

Typically the structural elements are assembled into an airframe skeleton that encloses payload areas or more accurately, payload volumes. These payload compartments are usually crammed full of electronic circuits such as TV transmitters, dataloggers, radio transmitters, receivers, assorted sensors and flight control systems. In some cases, all of this circuitry is considered as permanent components of the vehicle. However, not before this invention can any of this electronic payload "weight and volume burden" be considered an integral structural member of the airframe.

An important aspect of this invention is to fabricate the printed circuit boards of an electronic payload into the structural elements of an airframe. Printed circuit boards for the purpose of this invention comprises rigid or flexible multi-layer or single layer substrates, having conductive traces patterned into electrical circuits adhered to all or some of the layers. Substrate material includes but is not limited to, fiberglass, carbon fiber, paper, phenolic, plastic, plastic film and wood. Conductive traces can be, but are not limited to metal, conductive inks and conductive plastics.

Typical structural elements are, but not limited to, fuselage bulkheads, wing ribs, fin ribs, spars and stringers. All of these elements can be fabricated from printed circuit board materials with functional circuitry included. For example, a digital camera could be fashioned into a fuselage bulkhead, an airspeed sensing circuit could be made into a wing rib, a piezoelectric rate gyro circuit could be fashioned into an inclined fuselage bulkhead in order to provide wing leveling circuitry, etc.

Generally, a CAD system is used to draw the outline of the structural member or printed circuit board. In this case, because they are one in the same, the outline of the printed circuit board is also the outline of the structural member. Next, printed circuitry in the form of traces, component pads, vias and hole locations are added to the CAD drawing. An output of the drawing is typically processed with a photolithographic procedure onto a copper clad printed circuit board blank. A next step is to chemically etch the circuit traces and pads. A following step uses a router or laser to cut the structural member, i.e., printed circuit from the printed circuit blank. Once a finished structural member is cleaned and inspected, electrical and electronic parts are added completing the electronics assembly. Finally, each assembled printed circuit structural member is fastened to other printed circuit structural members forming the unmanned aerial vehicle's airframe. Circuit traces from one printed circuit structural member can be electrically coupled to other printed circuit structural members by way of mechanical, solder or conductive adhesive connections. In some cases, it may be desirable to employ opto-electronic coupling to communicate critical signals such as control signals from one printed circuit structural member to another.

The circuit itself can be single layer or multi-layer depending on the complexity of the circuit. Preferably, tiny surface mount parts such as 0402 size, resistors, capacitors, inductors and diodes would be used to keep weight as low as possible. When necessary, through hole parts such as leaded transistors, etc. can be accommodated. However, it is preferable that integrated circuits, discrete transistors and discrete diodes have surface mount technology packages as well. The circuit board material itself is preferably the lightest commercially available. A good choice would be conductor clad Rexolite®, a cross-linked polystyrene, plastic. Another interesting choice would be paper with conductive traces and pads formed from conductive ink. A balsa wood substrate having circuit traces adhered to its outer surface is yet another possibility.

Alternately or additionally, printed circuitry could be in the form of outer-skin that covers the fuselage, wings and control surfaces of the unmanned aerial vehicle. Preferably, at least part of the airframe is covered by flexible substrate material having conductive traces and component pads. This outer-skin preferably would be made from flexible circuits, such as those formed out of plastic film such as metal clad Mylar or as in the previous discussion formed from paper with conductive ink traces. Parts of the outer-skin could also be formed from paper batteries like those sold by Power Paper Technologies of Israel. The outer-skin can also be significantly formed by thin amorphous flexible solar cells or by ultra thin rechargeable battery technology. Furthermore, new micro fuel cell technology like that described in patents to Robert Hockaday could be integrated into the structural members or outer-skin. See U.S. Pat. No. 6,194,095.

Another very interesting possibility for the outer-skin of an unmanned aerial vehicle is realized by covering portions or all of the airframe with flexible sheets of organic light-emitting diodes otherwise known as OLEDs. Whenever electrical current passes through a sheet of OLEDs, a bright light is emitted. OLEDs can being used as video displays, therefore, an unmanned aerial vehicle covered in OLED's in communication with an onboard video can be used to actively camouflage the unmanned aerial vehicle. For example, the top of the airframe of the unmanned aerial vehicle can be covered in OLEDs and a video camera aimed out of the bottom of the unmanned aerial vehicle in communication with the top OLED outer-skin covering will cause a display of the terrain below to be presented to enemy observers looking down from a higher altitude. Likewise, an OLED bottom covering in communication with an upward-looking camera can present a sky camouflage to observers on the ground making the unmanned aerial vehicle practically invisible.

An example of the type of circuitry that could be formed into the outer-skin of a wing would be a disposable paper phone such as that patented by Randi Altschul. See U.S. Pat. No. 5,983,094 and U.S. Pat. No. 5,965,848. Preferably, because of the non-aerodynamic profile of some components, non-aerodynamic components would be mounted to circuit pads on the inside of the skin. The outer-skin typically is fastened to the fuselage with an adhesive

DETAILED DESCRIPTION OF THE PREFERRED EMBODIMENT

Figure 1:
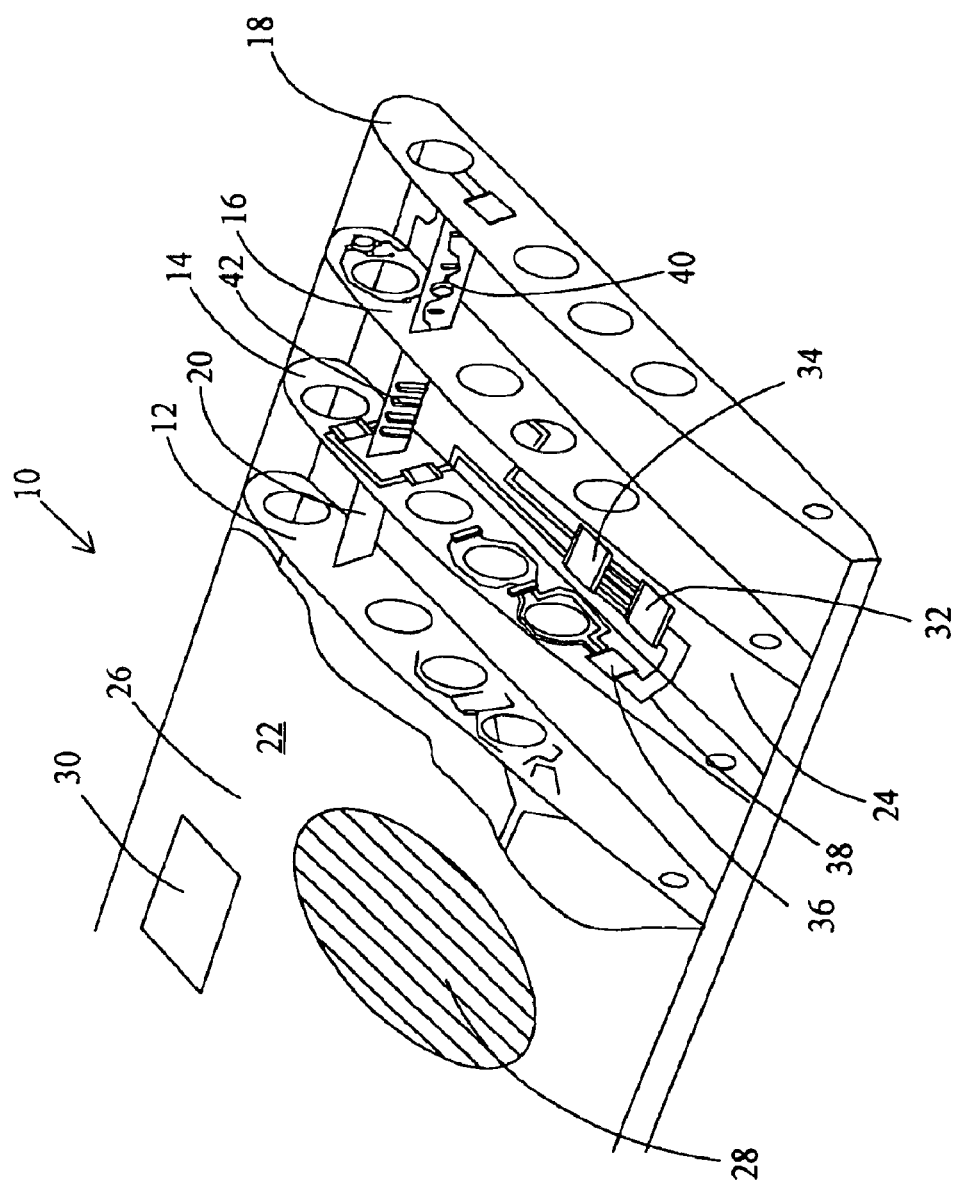
FIG. 1 is a cut-away view of a wing according to the present invention.

FIG. 1 depicts a cut-away perspective view of a wing according to the present invention. The wing, generally 10 includes ribs 12, 14, 16 and 18 that are mechanically connected by a spar 20. An outer-skin 22 covers the surface of wing 10. Outer-skin 22 has an inner surface 24 and an outer surface 26. Outer surface 26 can include very low profile circuits like a micro-patch antenna 28 and an organic light-emitting diode display 30. Inner surface 24 of outer-skin 22 can include higher profile circuit components such as integrated circuits 32 and 34. Wing rib 14 includes an integrated circuit 36 electrically connected by conductive trace 38. Wing spar 20 is shown having circuitry 40 including memory sockets 42.

Figure 2:
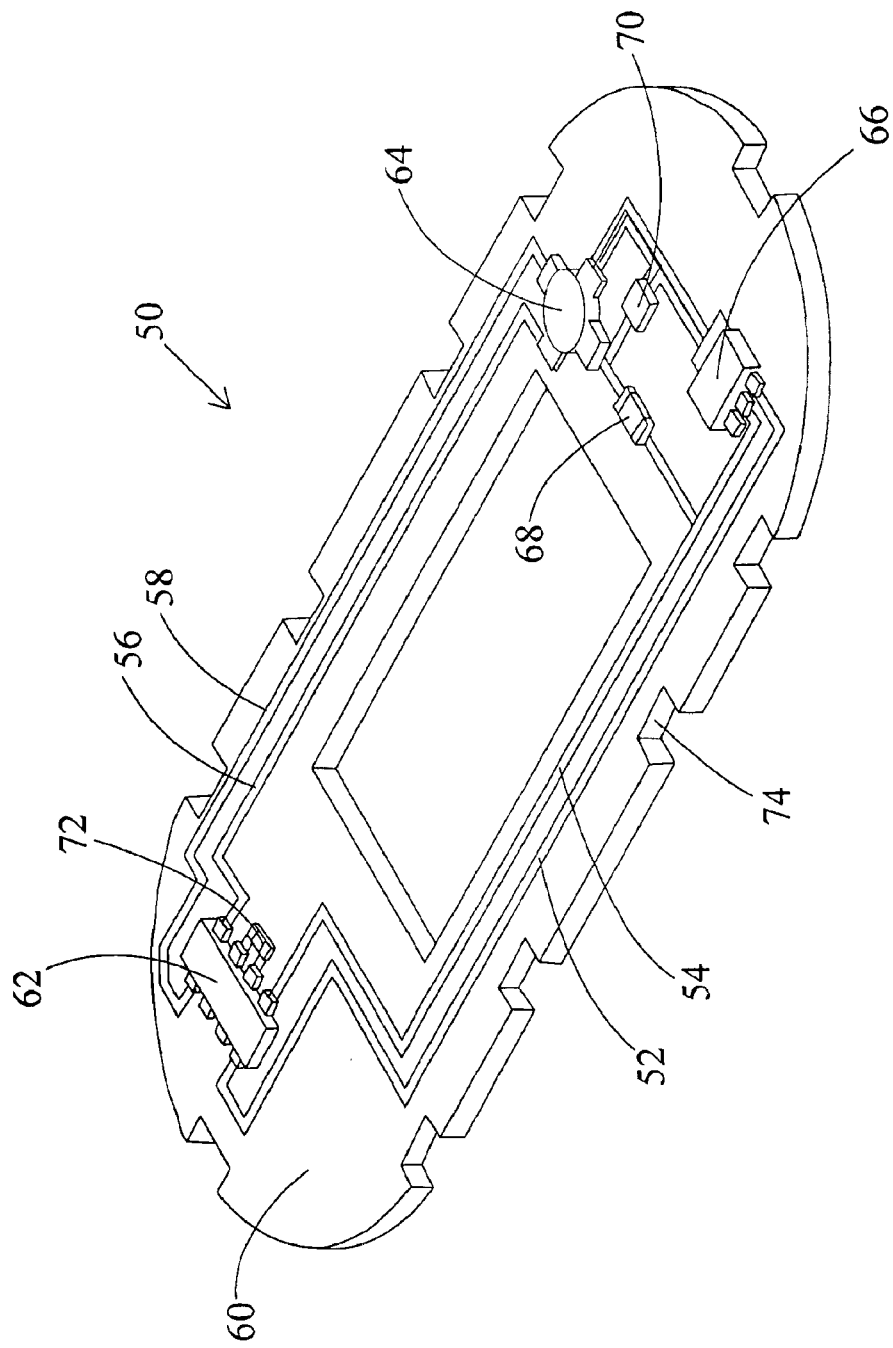
FIG. 2 is a fuselage bulkhead printed circuit board.

FIG. 2 depicts an airframe structural element useful as a fuselage bulkhead, generally 50. Bulkhead 50 is fabricated according to the present invention. Circuit traces 52, 54, 56, and 58 are adhered to a substrate 60. A surface mount technology packaged integrated circuit 62 is electrically connected to a microwave transistor 64 by conductive circuit traces 56 and 58. A voltage regulator is connected electrically to integrated circuit 62 by conductive circuit traces 52 and 54. A chip resistor 68 is electrically connected to transistor 64, regulator 66 and integrated circuit 62. A chip inductor 70 is connected electrically to transistor 64, regulator 66 and resistor 68. A chip capacitor 72 is connected between two pins belonging to integrated circuit 62. Notches 74 are provided for fuselage ribs (not shown).

Figure 3:
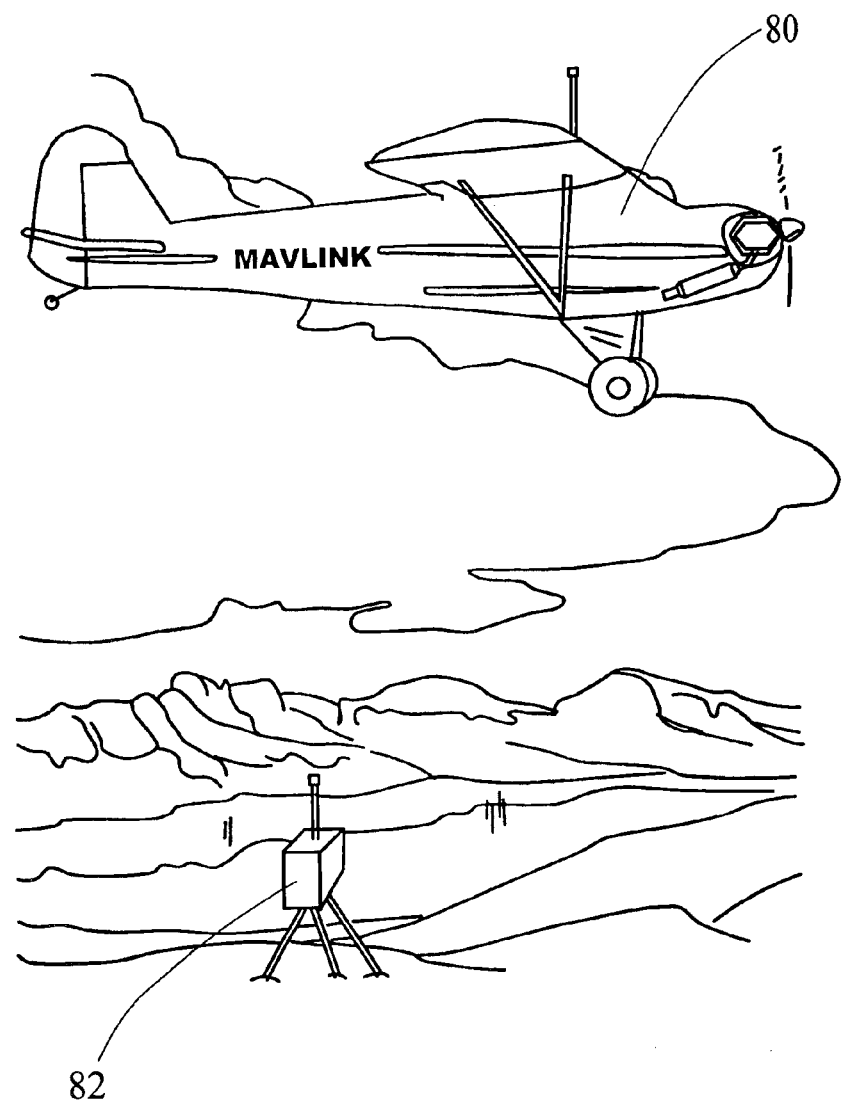
FIG. 3 shows an unmanned aerial vehicle retrieving data from a surface based data collector.
Figure 4:
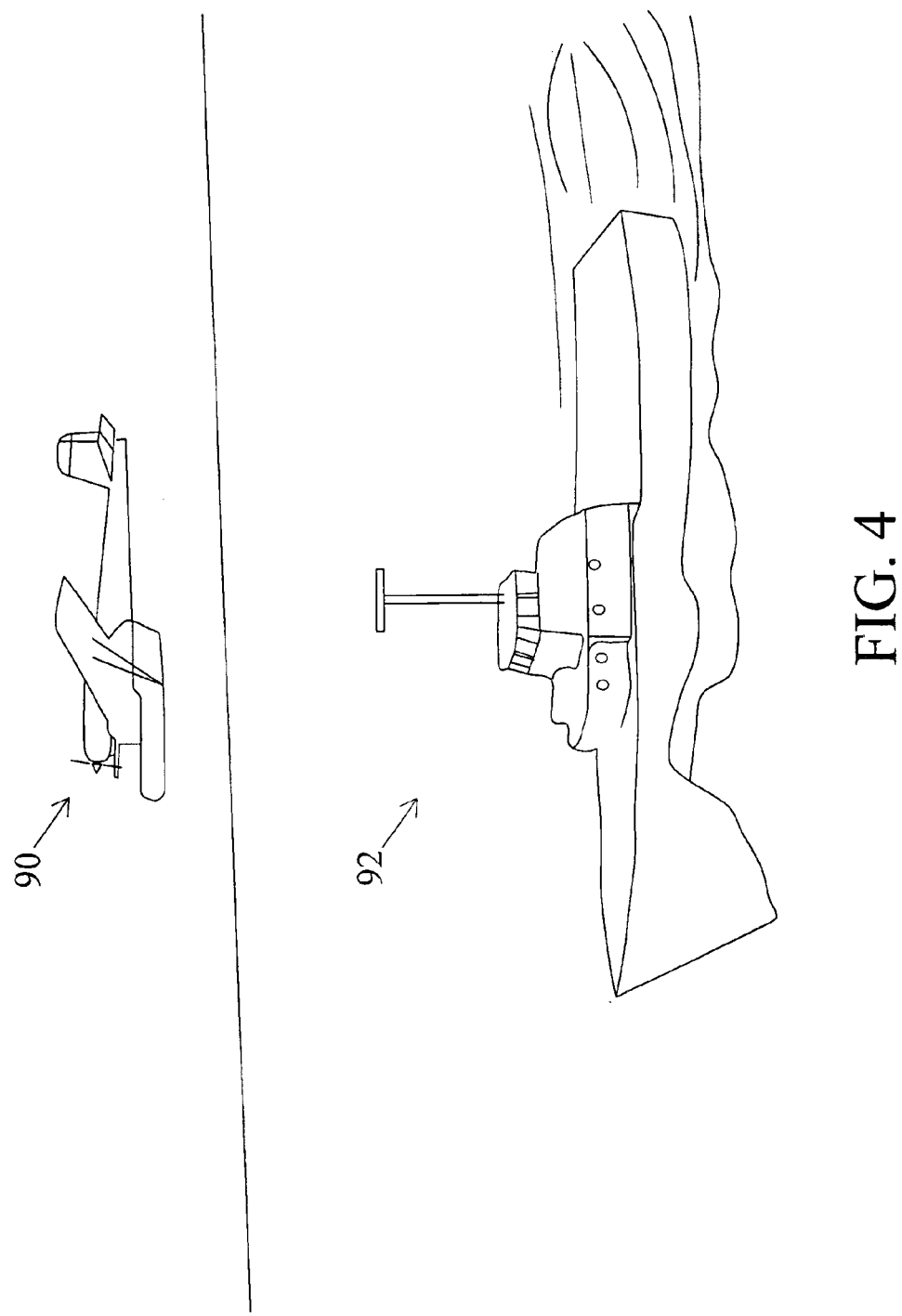
FIG. 4 shows an unmanned aerial vehicle accompanying a surface craft.

In accordance with the present invention, FIG. 3 shows an unmanned aerial vehicle 80 in autonomous flight retrieving data from a ground based data collection instrument 82. FIG. 4 depicts an unmanned aerial vehicle 90 flying in a pattern relative to the position of a surface object, in this case a marine vessel 92. Certain modifications and improvements will occur to those skilled in the art upon a reading of the foregoing description. It should be understood that all such modifications and improvements have been deleted herein for the sake of conciseness and readability but are properly within the scope of the following claims.

What is claimed is:

1. An unmanned aerial vehicle comprised of:
   a) an airframe at least partially constructed from a plurality of rigid multilayer printed circuit boards shaped in the form of airframe structural elements selected from the group consisting of fuselage bulkheads, wing ribs, fin ribs, spars and stringers; and
   b) an outer-skin covering over said airframe, at least a part of said covering being formed of a flexible substrate having a surface, and a printed circuit with conductive traces patterned into electrical circuits adhered to said surface.

2. The aerial vehicle of claim 1, wherein said covering is a plastic film.

3. The aerial vehicle of claim 1, wherein said printed circuit is formed of conductive ink.

4. The aerial vehicle of claim 1, wherein at least apart of said covering is a flexible solar cell.

5. The aerial vehicle of claim 1, wherein at least a part of said covering is made of a light-emitting diode display.

6. The aerial vehicle of claim 5, further including a video camera in communication with said light-emitting diode display.

7. An unmanned aerial vehicle comprising:
   an airframe at least partially constructed from a plurality of rigid multilayer printed circuit boards shaped in the form of airframe structural elements selected from the group consisting of fuselage bulkheads, wing ribs, fin ribs, spars and stringers, and a plurality of conductor traces adhered to said plurality of printed circuit boards are constructed of a material selected from the group consisting of metals, conductive inks and conductive plastics.

8. The aerial vehicle of claim 7, wherein said structural elements are formed of a material selected from the group consisting of fiberglass, carbon fiber, paper, phenolic, plastic and wood.

9. The aerial vehicle of claim 7, wherein said plurality of printed circuit boards include component pads and electronic components adhered to said component pads.

10. The aerial vehicle of claim 9, wherein said electronic components are selected from the group consisting of integrated circuits, transistors, diodes, resistors, inductors and capacitors.

11. The aerial vehicle of claim 7, further including a transmitter.

12. The aerial vehicle of claim 11, wherein said transmitter is an ultra-wideband transmitter.

13. The aerial vehicle of claim 7, further including a receiver.

14. The aerial vehicle of claim 13, wherein said receiver is an ultra-wideband receiver.

* * * * *